United States Patent
Syu et al.

(10) Patent No.: US 9,026,893 B1
(45) Date of Patent: May 5, 2015

(54) DYNAMICALLY ASSIGNING INACTIVE PAGES NOT USED IN REED-SOLOMON CODE IN NON-VOLATILE SOLID-STATE STORAGE ARRAY

(71) Applicant: Western Digital Technologies, Inc., Irvine, CA (US)

(72) Inventors: Mei-Man L. Syu, Fremont, CA (US); Cliff Pajaro, Costa Mesa, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 37 days.

(21) Appl. No.: 13/713,561

(22) Filed: Dec. 13, 2012

(51) Int. Cl.
*H03M 13/11* (2006.01)
*G06F 11/10* (2006.01)
*H03M 13/15* (2006.01)
*H03M 13/53* (2006.01)

(52) U.S. Cl.
CPC ....... *G06F 11/1076* (2013.01); *H03M 13/1515* (2013.01); *G06F 11/1068* (2013.01)

(58) Field of Classification Search
CPC ............ G06F 11/1076; G06F 11/1068; G06F 11/1008; G06F 11/10; H03M 13/1515; G11B 20/1833; H04L 1/0061; H04L 1/0057; H04L 1/0045
See application file for complete search history.

(56) References Cited

U.S. PATENT DOCUMENTS

| | | | |
|---|---|---|---|
| 5,696,927 A * | 12/1997 | MacDonald et al. | 711/207 |
| 6,240,525 B1 * | 5/2001 | Chiang | 714/6.13 |
| 2005/0022084 A1 * | 1/2005 | Hii et al. | 714/733 |
| 2009/0083591 A1 * | 3/2009 | Brune et al. | 714/718 |
| 2009/0157950 A1 * | 6/2009 | Selinger | 711/103 |
| 2010/0095148 A1 * | 4/2010 | Cheng | 714/6 |
| 2010/0122148 A1 * | 5/2010 | Flynn et al. | 714/773 |
| 2011/0066793 A1 * | 3/2011 | Burd | 711/103 |
| 2011/0131472 A1 | 6/2011 | Antonakopoulos et al. | |
| 2012/0005561 A1 | 1/2012 | Trager et al. | |
| 2012/0159262 A1 * | 6/2012 | Santana da Costa et al. | 714/42 |

* cited by examiner

*Primary Examiner* — April Y Blair
*Assistant Examiner* — Dipakkumar Gandhi (57) ABSTRACT

A data storage device is disclosed comprising non-volatile solid-state array comprising M storage elements for storing data protected by Reed-Solomon (R-S) code, each storage element comprising multiple blocks, each block comprising multiple pages for storing data. The data storage device further comprises a controller in communication with the storage array and defining a superblock comprising logical grouping of M blocks, each located in different storage element, and multiple superpages in each superblock, each superpage comprising M pages, each located in a different storage element. The controller generates, for each superpage, at least one R-S code parity page for protecting data pages in the superpage, where number of data pages and the at least one parity page is equal to M−1. The controller assigns one page in each superpage as an inactive page not used in the R-S code, where at least two inactive pages are in different storage elements.

34 Claims, 5 Drawing Sheets

DYNAMICALLY ASSIGNING INACTIVE PAGES NOT USED IN REED-SOLOMON CODE IN NON-VOLATILE SOLID-STATE STORAGE ARRAY

BACKGROUND

Non-volatile solid-state storage arrays in data storage devices (e.g., solid state drives), typically comprise multiple storage elements (e.g., dies), where each storage element comprises multiple data blocks, and each data block comprises multiple pages for storing user data. An error correction code, such as a Reed-Solomon (R-S) code, may be used to protect the user data stored in the pages from loss due to uncorrectable errors by providing R-S parity pages. A commonly used R-S code uses a codeword comprising 8-bit symbols, where the number of symbols in the codeword is equal to $2^N-1$ (e.g., 255).

In a non-volatile solid-state storage array, an R-S code may be used to provide page-level error protection for a group of pages, where the number of pages in the group (including data pages and R-S parity pages) is limited by the number of symbols in the R-S codeword. By using an R-S code comprising an 8-bit symbol R-S codeword, for example, page-level error protection may be provided for a total of 255 pages including data pages and at least one R-S parity page.

DETAILED DESCRIPTION

Embodiments of the invention are directed to dynamically assigning inactive pages not used in Reed-Solomon (R-S) code in a non-volatile solid-state storage array in a data storage device. In embodiments of the invention, the non-volatile solid-state storage array comprises a plurality of storage elements for storing data protected by an R-S code, wherein each storage element comprises a plurality of blocks of memory, with each block comprising a plurality of pages for storing data. In embodiments of the invention, an R-S code comprising an N-bit symbol codeword is used for data protection, wherein the number of symbols in the codeword is equal to $2^N-1$. For example, in an embodiment in which the R-S codeword comprises 8-bit symbols is used, the codeword comprises 255 symbols.

In embodiments of the invention, a superpage is defined as a logical grouping of pages, wherein each page is located in a different storage element. In an embodiment wherein each storage element is a die, for example, each page in a superpage is located in a different die. In embodiments of the invention, each superpage comprises at least one R-S parity page (simply referred to as a "parity page" in the present application) for protecting data pages in the superpage. In embodiments of the invention, the number of data pages and the at least one parity page in a superpage is equal to M−1, wherein M is the number of storage elements for storing data protected by the R-S code, and wherein each page in the superpage is located in one of the M storage elements.

The number of parity pages in a superpage determines how many defective pages the R-S code can correct in the superpage. For example, in an embodiment wherein a super page comprises one parity page, the R-S code can be used to correct one defective page. On the other hand, in an embodiment wherein a superpage comprises two parity pages, for example, the R-S code can be used to correct two defective pages.

In embodiments of the invention wherein the number of data pages and the at least one parity page in a superpage is equal to M−1, one page in each superpage is not used in the R-S code. In embodiments of the invention, the page that is not used in the R-S code in each superpage is assigned as an inactive page. In an embodiment, a defective page in a superpage may be assigned as an inactive page.

In embodiments of the invention, the inactive page in at least one superpage is moved from one location in a storage element to another location in a different storage element during an operation performed on the non-volatile solid-state storage array. In one embodiment of the invention, the inactive page in at least one superpage may be moved, for example, during a wear leveling operation. A wear leveling operation, as is known in the art, typically involves moving data content in a first block to a second block that has just reached a predetermined erase level/count due to a recent erase operation. In the wear leveling operation, the first block is then erased and made available for a future write operation. In one embodiment, the inactive page in at least one superpage may be moved, for example, during a garbage collection operation. As is known in the art, a garbage collection operation typically involves consolidating valid data into dedicated blocks and freeing up storage space by erasing the blocks from which valid data have been copied in the consolidation process.

Various embodiments of the invention will now be described. These embodiments are presented by way of example only, and are not intended to limit the scope of the invention. Various omissions, substitutions and changes in the form of the methods and devices described herein may be made without departing from the spirit of the invention. To illustrate some of the embodiments, reference will now be made to the figures.

Figure 1:
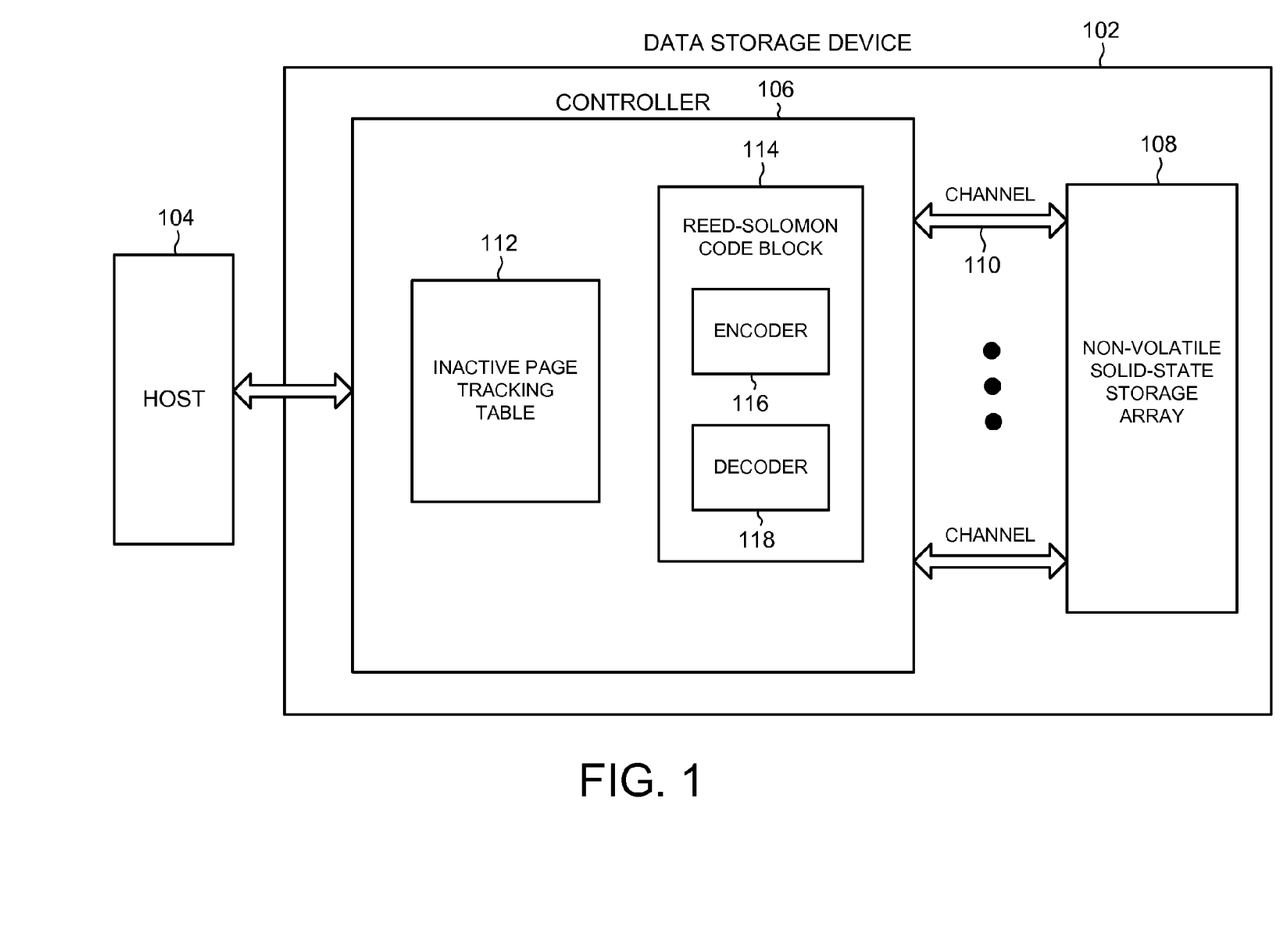
FIG. 1 is a block diagram illustrating a data storage device according to an embodiment of the present invention comprising a controller in communication with a non-volatile sold-state storage array.

FIG. 1 shows a data storage device 102 in communication with a host 104 and comprising a controller 106 in communication with a non-volatile solid-state storage array 108 via a plurality of channels 110, according to an embodiment of the invention. In an embodiment of the invention, the non-volatile solid-state storage array 108 comprises M storage elements for storing data protected by an R-S code, wherein each storage element comprises a plurality of blocks, and wherein each block comprises a plurality of pages for storing data. In one embodiment, each storage element comprises a die. In one embodiment, wherein a die comprises two or more planes, each storage element comprises a plane. In one embodiment, each storage element comprises flash memory (e.g., NAND or NOR flash). In other embodiments, each storage element may comprise, for example, Phase-change Random Access Memory (PRAM), Resistive-change RAM (ReRAM), Magnetoresistive RAM (MRAM) or other type of non-volatile solid-state memory.

In one embodiment, the controller 106 communicates with a host 104 using a standard data storage communication protocol (e.g., the ATA protocol). The host 104 in this embodiment may comprise a separate microprocessor (e.g., in a desktop or laptop computer) which communicates with the SSD over a suitable interface (e.g., serial or parallel ATA). In another embodiment, the data storage device 102 may be implemented within a consumer device (e.g., a camera or cell phone). In one embodiment, the data storage device 102 further comprises magnetic media (e.g., one or more disks) for storing data.

In one embodiment of the invention, the controller 106 is operable to define a superblock comprising a logical grouping of M blocks, wherein each block in the superblock is located in a different storage element, wherein each superblock comprises a plurality of superpages, wherein each superpage comprises a logical grouping of M pages, and wherein each page in a superpage is in a different storage element.

In an embodiment, the controller 106 is further operable to generate, for each superpage, at least one R-S code parity page protecting data pages in the superpage, wherein the number of data pages and the at least one parity page is equal to M−1. For example, in an embodiment wherein each storage element comprises a die, the R-S code comprises a codeword comprising 8-bit symbols, and M is equal to 256, the sum of the at least one parity page and the data pages is equal to 255. In that embodiment, a single parity page can correct one defective data page, while two parity pages can correct two defective data pages.

In an embodiment of the invention, the controller 106 is further operable to assign one page in each superpage as an inactive page not used in the R-S code, wherein at least two of the inactive pages are in different storage elements. In one embodiment, at least two inactive pages in at least two superpages in a superblock are in different storage elements. In another embodiment, all of the inactive pages in all of the superpages in a superblock are in the same storage element. In one embodiment, the controller 106 is operable to assign a defective page in a superpage as the inactive page. The defective page may be, for example, a page that was found to be defective during initial processing of the non-volatile solid-state storage array 108, or a page that was found to be defective during subsequent operation of the storage array 108. In one embodiment, the controller 106 is operable to assign a page having a quality level below a threshold in a superpage as the inactive page. For example, the quality level of a page may be determined by number of Error Correction Code (ECC) errors associated with the page.

In an embodiment of the invention, the controller 106 is further operable to move the inactive page in at least one superpage from a first location in a first storage element to a second location in a second storage element. In one embodiment, the controller 106 is operable to move the inactive page during a wear leveling operation. In one embodiment, the controller 106 is operable to move the inactive page during a garbage collection operation. In one embodiment, the controller 106 is operable to move the inactive page during an error handling operation. For example, during an error handling operation, data in a page with an uncorrectable error is recovered using an R-S parity page, and the page with the recovered data is assigned as the inactive page in that superpage.

In one embodiment, when a page has an ECC error that is corrected during an error handling operation, the page is flagged and assigned as the inactive page in the superpage in which it resides during a subsequent wear leveling operation. In one embodiment, after a page having a low quality level is assigned as the inactive page in a superpage, the inactive page is subsequently moved from the low quality page to a page in the superpage having a lower quality level, such as a page having a higher number of ECC errors. In an embodiment, the inactive page is moved to a different page in the superpage after a predetermined number of erase cycles has occurred. This has the effect of rotating the assigned inactive page within a superpage so as to distribute the wear on the memory more evenly.

In the embodiment in FIG. 1, the controller 106 comprises a tracking table 112 for tracking inactive pages in superpages. In an embodiment wherein all of the inactive pages in all of the superpages in are located in the same storage element, the controller 106 used the tracking table 112 to track the storage element that the inactive page is located in for each superblock. In an embodiment wherein at least two inactive pages in at least two superpages in at least one superblock are located in different storage elements, the controller 106 uses the tracking table 112 to track the storage element in which the inactive page in each superpage is located. In one embodiment, the controller 106 also uses the tracking table to track the location of the at least one parity page in each superpage. In one embodiment, during operation of the data storage device 102, the tracking table 112 is stored in a volatile memory that may be (1) within the controller (as shown in FIG. 1) or (2) external to the controller. The tracking table 112 may be saved to the non-volatile solid-state storage array 108 on a periodic basis for persistence over power-cycles. In other embodiments, the tracking is performed using bit flags, bit maps and/or other suitable data structures.

In the embodiment of the invention in FIG. 1, the controller 106 further comprises a functional block/code module R-S code block 114 for providing R-S error protection for each logical grouping of pages defining a superpage. The R-S code block 114 comprises an encoder 116 for providing R-S codeword encoding and a decoder 118 for providing R-S codeword decoding.

Figure 2:
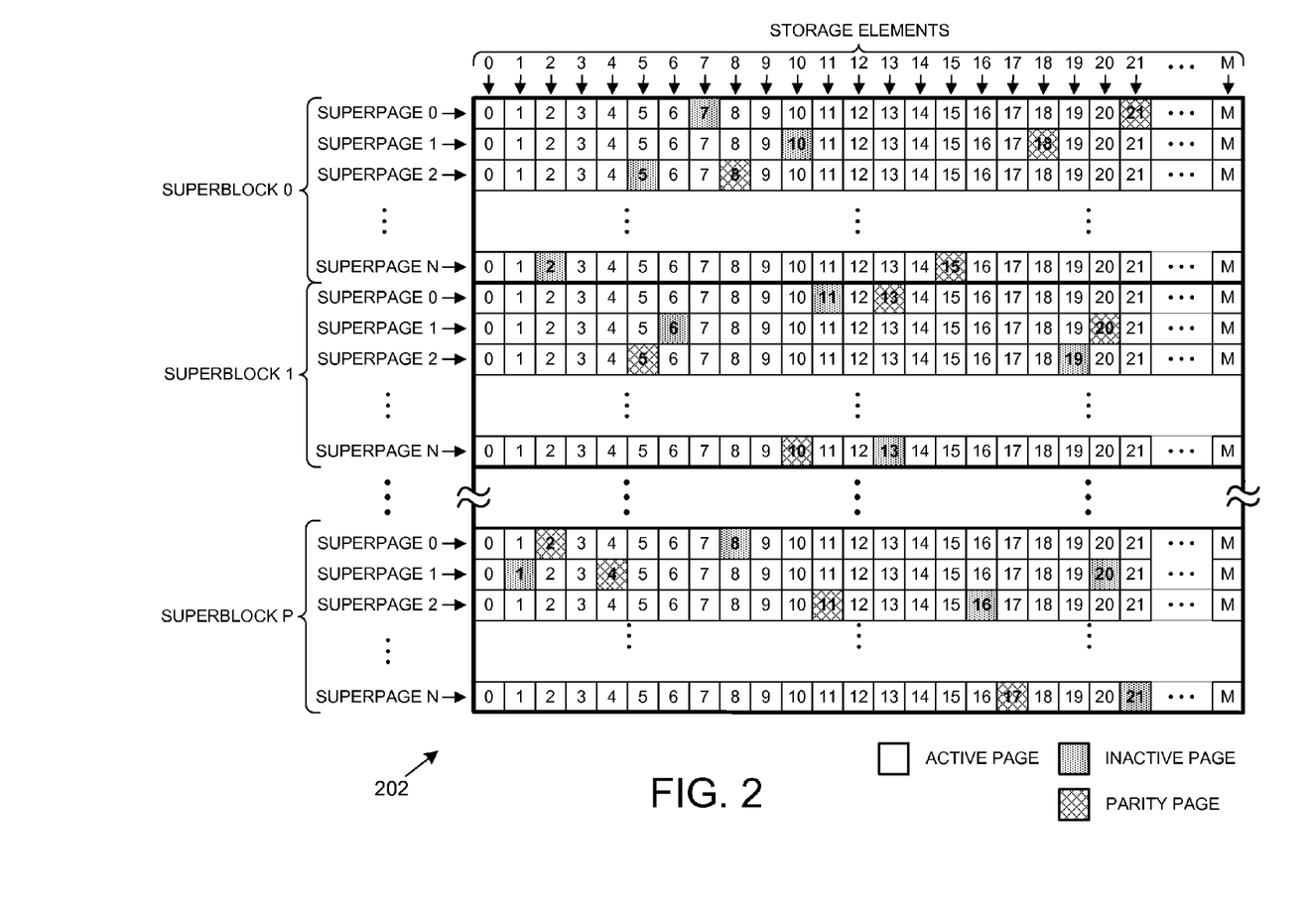
FIG. 2 is an example of a logical data storage arrangement including superpages comprising inactive pages, active pages, and parity pages in a non-volatile solid-state storage array according to an embodiment of the invention.

FIG. 2 shows a logical data storage arrangement 202 in a non-volatile solid-state storage array according to an embodiment of the invention. The logical data storage arrangement 202 in FIG. 2 shows M storage elements for storing data protected by R-S code and comprising superblocks 0-P, wherein each superblock comprises superpages 0-N, wherein each superpage comprises M pages for storing data, and wherein each page in a superpage is located in a different one of M storage elements. In one embodiment, each storage element comprises a die. In an embodiment wherein a die comprises two or more planes, each storage element comprises a plane.

As shown in FIG. 2, active pages for storing user data are indicated by boxes without shading or cross-hatching, inactive pages not used in the R-S code are indicated by boxes with shading, and R-S parity pages are indicated by boxes with cross-hatching. In embodiments of the invention, each superpage comprises one inactive page and at least one parity page. In the embodiment in FIG. 2, at least two inactive pages in at least two superpages in each superblock are located in different storage elements. For example, in superblock 0, the inactive page in superpage 0 is located in storage element 7, while the inactive page in superpage 2 is located in storage element 5. In the embodiment shown in FIG. 2, at least two parity pages in at least two superpages in at least one superblock are located in different storage elements. For example, in superblock 1, a parity page in superpage 0 is located in storage element 13, while a parity page in superpage 1 is located in storage element 20. In one embodiment, at least two inactive pages in at least two superpages in each superblock are located in different storage elements, and all of the parity pages in all of the superpages in at least one superblock are located in the same storage element.

Figure 3:
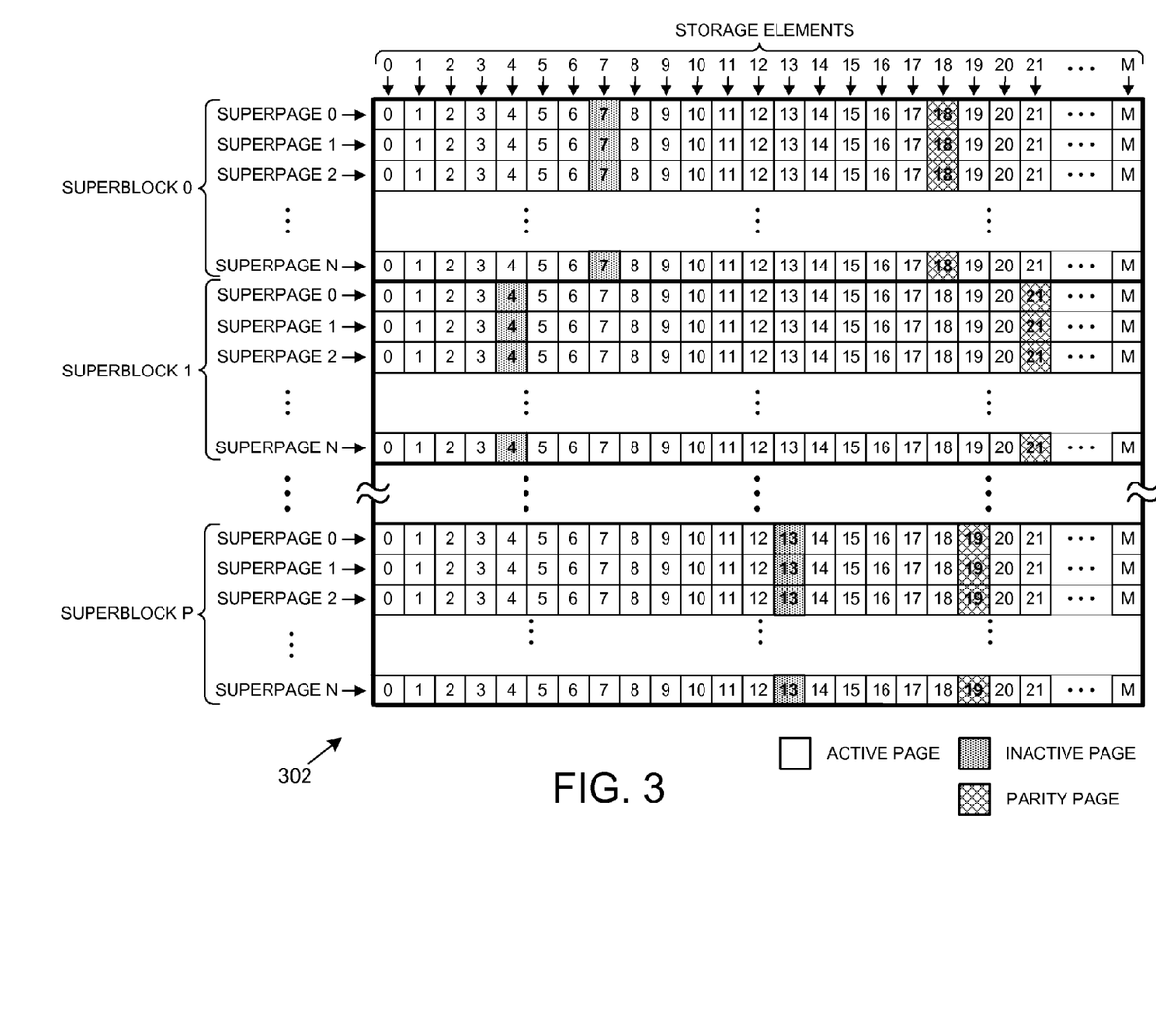
FIG. 3 is an example of a logical data storage arrangement including superpages comprising inactive pages, active pages, and parity pages in a non-volatile solid-state storage array according to an embodiment of the invention.

FIG. 3 shows a logical data storage arrangement 302 in a non-volatile solid-state storage array according to an embodiment of the invention. The arrangement of storage elements, superblocks, and superpages in logical data storage arrangement 302 is similar to the arrangement of storage elements, superblocks, superpages in logical data storage arrangement 202 in FIG. 2. However, the location of inactive pages and parity pages is different in logical data storage arrangement 302. In the embodiment in FIG. 3, all of the inactive pages in the superpages in each superblock are located in the same storage element, and at least two inactive pages in superpages in at least two superblocks are located in different storage elements. For example, all of the inactive pages in the superpages in superblock 0 are located in storage element 7, while all of the inactive pages in the superpages in superblock 1 are located in storage element 4.

In the embodiment in FIG. 3, all of the parity pages in the superpages in each superblock are located in the same storage element, and at least two parity pages in superpages in at least two superblocks are located in different storage elements. For example, all of the parity pages in the superpages in superblock 0 are located in storage element 18, while all of the parity pages in the superpages in superblock 1 are locate in storage element 21. In one embodiment, all of the inactive pages in the superpages in each superblock are located in the same storage element, at least two inactive pages in superpages in at least two superblocks are located in different storage elements, and at least two parity pages in at least two superpages in at least one superblock are located in different storage elements. In one embodiment, each superpage comprises two or more parity pages, and each parity page is located in a different storage element.

Figure 4:
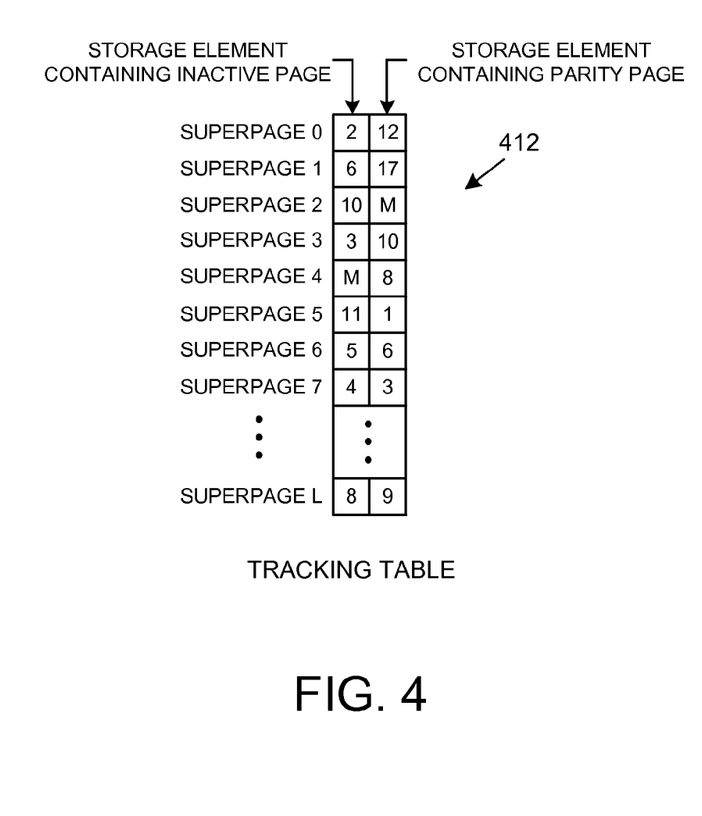
FIG. 4 is an example of a tracking table used for tracking the storage element in which each inactive page in each superpage is located according to an embodiment of the invention.

FIG. 4 shows a tracking table 412 according to one embodiment of the invention. In the embodiment shown in FIG. 4, the tracking table 412 is used for tracking the storage element in which the inactive page is located and the storage element in which a parity page is located for each of the superpages 0-L. For example, in superpage 1, the inactive page is located in storage element 6 and a parity page is located in storage element 17. In the embodiment in FIG. 4, at least two inactive pages in at least two superpages in each superblock are located in different storage elements. In one embodiment, the tracking table 412 tracks the location of the inactive page and two or more parity pages for each superpage.

Figure 5:
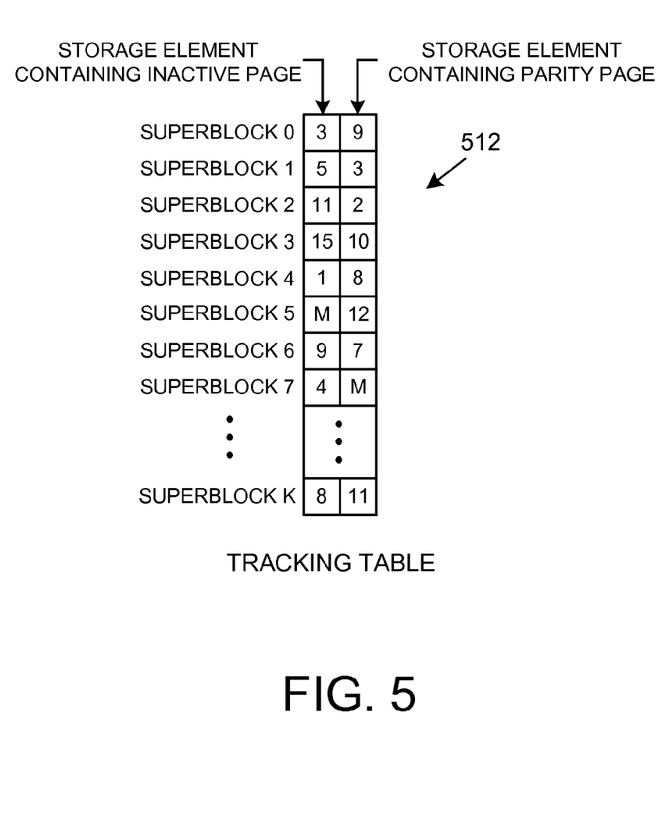
FIG. 5 is another example of a tracking table used for tracking the storage element in which each inactive page in each superpage is located according to an embodiment of the invention.

FIG. 5 shows a tracking table 512 according to one embodiment of the invention. In the embodiment shown in FIG. 5, the tracking table 512 is used for tracking the storage element in which the inactive page is located and the storage element in which a parity page is located for each of the superblocks 0-K, wherein all of the inactive pages in all of the superpages in each superblock are located in the same storage element, and wherein all of the parity pages in all of the superpages in each superblock are located in the same storage element. For example, the inactive pages in all of the superpages in superblock 2 are located in storage element 11 and the parity pages in all of the superpages in superblock 2 are located in storage element 2. In one embodiment, each superpage comprises an inactive page and two or more parity pages, wherein all of the inactive pages in all of the superpages in each superblock are located in the same storage element, and wherein each of the two or more parity pages in all of the superpages in each superblock are located in the same storage element.

The tracking table 512 in FIG. 5 has a lower granularity compared to the tracking table 412 in FIG. 4 because all of the inactive pages in all of the superpages of each superblock are in the same storage element in the embodiment in FIG. 5, whereas two or more of the inactive pages in the superpages in a superblock in the embodiment in FIG. 4 are in different storage elements. However, because of its lower granularity, the tracking table 512 in FIG. 5 consumes less memory (i.e., storage space) than the tracking table 412 in the embodiment in FIG. 4.

Figure 6:
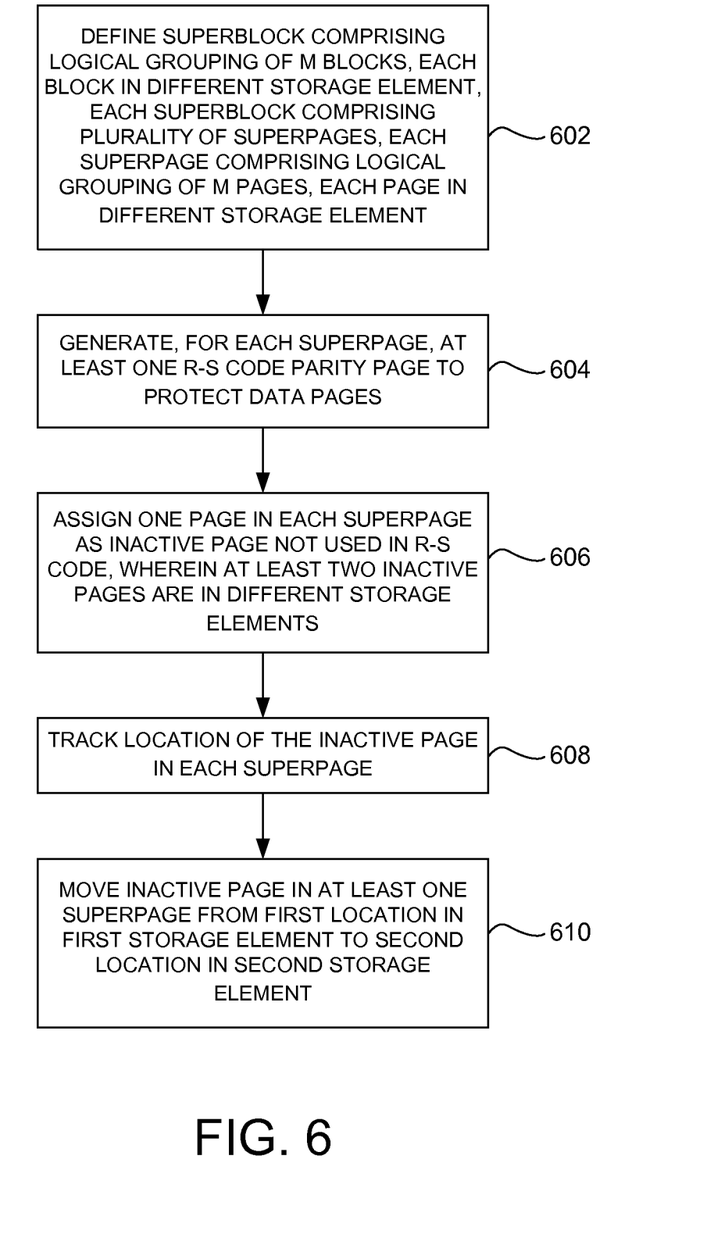
FIG. 6 is a flow diagram according to an embodiment of the present invention, wherein one page in each superpage is assigned as an inactive page not used in Reed-Solomon (R-S) code, wherein at least two inactive pages are in different storage elements, wherein the location of the inactive page in each superpage is tracked, and wherein an inactive page in at least one superpage is moved from a first location in a first storage element to a second location in a second storage element.

FIG. 6 is a flow diagram executed by a controller 106 (FIG. 1) according to an embodiment of the present invention, wherein the controller 106 defines a superblock comprising a logical grouping of M blocks, wherein each block is in a different storage element, wherein each superblock comprises a plurality of superpages, wherein each superpage comprises a logical grouping of M pages, and wherein each page is in a superpage is in a different storage element (block 602). In the embodiment shown in the flow diagram in FIG. 6, the controller 106 generates, for each superpage, at least one R-S code parity page to protect data pages (block 604). In one embodiment, the controller 106 generates two or more R-S code parity pages for each superpage to protect data pages.

In the embodiment shown in the flow diagram in FIG. 6, the controller 106 assigns one page in each superpage as an inactive page not used in the R-S code, wherein at least two inactive pages are in different storage elements (block 606). In one embodiment, at least two of the inactive pages in at least two superpages in at least one of the superblocks are located in different storage elements. In one embodiment, all of the inactive pages in all of the superpages in each superblock are located in the same storage element, and at least two inactive pages in at least two superblocks are located in different storage elements.

In the embodiment of the invention in FIG. 6, the controller 106 tracks the location of the inactive page in each superpage (block 608), and moves the inactive page in at least one superpage from a first location in a first storage element to a second location in a second storage element (block 610). In one embodiment, the controller 106 tracks the location of the inactive page in each superpage using a tracking table. In an embodiment wherein all of the inactive pages in all of the superpages are located in the same storage element, the controller 106 uses the tracking table to track the storage element that the inactive page is located in for each superblock. In an embodiment wherein at least two inactive pages in at least two superpages in at least one superblock are located in different storage elements, the controller 106 uses the tracking table to track the storage element in which the inactive page in each superpage is located. In one embodiment, the controller 106 also uses the tracking table to track the location of the at least one parity page in each superpage.

In one embodiment of the invention, the controller 106 moves the inactive page in at least one superpage from a first location in a first storage element to a second location in a second storage element during a wear leveling operation. In one embodiment, the controller 106 moves the inactive page in at least one superpage from a first location in a first storage element to a second location in a second storage element during a garbage collection operation. In one embodiment, the controller 106 moves the inactive page in at least one superpage from a first location in a first storage element to a second location in a second storage element during an error handling operation.

It is noted that the steps in the flow diagram in FIG. 6 are shown in a particular order to illustrate an embodiment of the invention. In other embodiments, the actions in the flow diagram in FIG. 6 may be performed in a different order.

The controller 106 in the data storage device 102 (FIG. 1) may comprise any suitable circuitry, such as one or more integrated circuits. In one embodiment, the controller 106 comprises a microprocessor executing code segments of a control program for implementing the above described flow diagram. Alternatively, or in addition to the microprocessor, the controller 106 may comprise state machine circuitry implemented in an application specific integrated circuit.

What is claimed is:

1. A data storage device comprising:
a non-volatile solid-state storage array comprising M storage elements for storing data protected by a Reed-Solomon code, each storage element comprising a plurality of blocks, and each block comprising a plurality of pages for storing data;
a controller in communication with the non-volatile solid-state storage array and operable to:
define a superblock comprising a logical grouping of M blocks, wherein each block in the superblock is located in a different storage element, wherein each superblock comprises a plurality of superpages, wherein each superpage comprises a logical grouping of M pages, and wherein each page in a superpage is in a different storage element;
generate, for each superpage, at least one Reed-Solomon code parity page protecting data pages in the superpage, wherein the number of data pages and the at least one parity page is equal to M−1; and
assign one page in each superpage as an inactive page not used in the Reed-Solomon code, wherein at least two of the inactive pages are in different storage elements.

2. The data storage device as recited in claim 1, wherein the controller is further operable to move the inactive page in at least one superpage from a first location in a first storage element to a second location in a second storage element.

3. The data storage device as recited in claim 2, wherein the controller is operable to move the inactive page in at least one superpage during a wear leveling operation.

4. The data storage device as recited in claim 2, wherein the controller is operable to move the inactive page in at least one superpage during a garbage collection operation.

5. The data storage device as recited in claim 2, wherein the controller is operable to move the inactive page in at least one superpage during an error handling operation.

6. The data storage device as recited in claim 1, wherein the controller is further operable to track the location of the inactive page in each superpage.

7. The data storage device as recited in claim 6, wherein the controller is operable to track the location of the inactive page in each superpage by using a tracking table.

8. The data storage device as recited in claim 1, wherein the controller is operable to assign a defective page in a superpage as the inactive page.

9. The data storage device as recited in claim 1, wherein the controller is operable to assign a page having a quality level below a threshold in a superpage as the inactive page.

10. The data storage device as recited in claim 1, wherein at least two inactive pages in at least two superpages in a superblock are in different storage elements.

11. The data storage device as recited in claim 1, wherein all of the inactive pages in all of the superpages in a superblock are in the same storage element.

12. The data storage device as recited in claim 1, wherein the storage element comprises a die.

13. The data storage device as recited in claim 1, wherein the storage element comprises a plane, and wherein at least two planes are located in one die.

14. The data storage device as recited in claim 1, wherein M is equal to 256.

15. The data storage device as recited in claim 1, wherein the Reed-Solomon code comprises 8-bit symbols.

16. The data storage device as recited in claim 1, further comprising magnetic media for storing data.

17. The data storage device as recited in claim 1, wherein the inactive page is assigned in each and every superpage within the super block.

18. The data storage device as recited in claim 1, wherein the inactive page is dynamically assigned to each superpage regardless of whether a defect occurs in the superpage.

19. A method of operating a data storage device, the data storage device comprising a non-volatile storage array comprising M storage elements for storing data protected by a Reed-Solomon code, each storage element comprising a plurality of blocks, and each block comprising a plurality of pages for storing data, the method comprising:
defining a superblock comprising a logical grouping of M blocks, wherein each block in the superblock is located in a different storage element, wherein each superblock comprises a logical grouping of M pages, and wherein each page in a superpage is in a different storage element;
generating, for each superpage, at least one Reed-Solomon code parity page protecting data pages in the superpage, wherein the number of data pages and the at least one parity page is equal to M−1; and
assigning one page in each superpage as an inactive page not used in the Reed-Solomon code, wherein at least two of the inactive pages are in different storage elements.

20. The method as recited in claim 19, further comprising moving the inactive page in at least one superpage from a first location in a first storage element to a second location in a second storage element.

21. The method as recited in claim 20, wherein the inactive page in at least one superpage is moved during a wear leveling operation.

22. The method as recited in claim 20, wherein the inactive page in at least one superpage is moved during a garbage collection operation.

23. The method as recited in claim 20, wherein the inactive page in at least one superpage is moved during an error handling operation.

24. The method as recited in claim 19, further comprising tracking the location of the inactive page in each superpage.

25. The method as recited in claim 24, wherein tracking the location of the inactive page in each superpage comprises using a tracking table.

26. The method as recited in claim 19, further comprising assigning a defective page in a superpage as the inactive page.

27. The method as recited in claim 19, further comprising assigning a page having a quality level below a threshold in a superpage as the inactive page.

28. The method as recited in claim 19, wherein at least two inactive pages in at least two superpages in a superblock are in different storage elements.

29. The method as recited in claim 19, wherein all of the inactive pages in all of the superpages in a superblock are in the same storage element.

30. The method as recited in claim 19, wherein the storage element comprises a die.

31. The method as recited in claim 19, wherein the storage element comprises a plane, and wherein at least two planes are located in one die.

32. The method as recited in claim 19, wherein M is equal to 256.

33. The method as recited in claim 19, wherein the Reed-Solomon code comprises 8-bit symbols.

34. The method as recited in claim 19, wherein the data storage device further comprises magnetic media for storage data.

* * * * *